(12) United States Patent
Jung et al.

(10) Patent No.: US 7,576,395 B2
(45) Date of Patent: Aug. 18, 2009

(54) DUAL GATE STACK CMOS STRUCTURE WITH DIFFERENT DIELECTRICS

(75) Inventors: Hyung-Suk Jung, Gyeonggi-do (KR); Jong-Ho Lee, Gyeonggi-do (KR); Hwa-Sung Rhee, Gyeonggi-do (KR); Jae-Kwang Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 11/044,968

(22) Filed: Jan. 27, 2005

(65) Prior Publication Data

US 2006/0003507 A1 Jan. 5, 2006

(30) Foreign Application Priority Data

Jul. 5, 2004 (KR) ............. 10-2004-0051852

(51) Int. Cl.
*H01L 23/62* (2006.01)
(52) U.S. Cl. ............... 257/351; 257/E27.064
(58) Field of Classification Search ......... 257/351, 257/E27.064
See application file for complete search history.

(56) References Cited

U.S. PATENT DOCUMENTS

| | | | |
|---|---|---|---|
| 6,271,115 B1 * | 8/2001 | Liu et al. ............ 438/618 |
| 6,518,106 B2 | 2/2003 | Ngai et al. ............ 438/157 |
| 6,528,858 B1 | 3/2003 | Yu et al. | |
| 6,545,324 B2 | 4/2003 | Madhukar et al. ...... 257/371 |
| 6,617,210 B1 | 9/2003 | Chau et al. ............ 438/240 |
| 2002/0190302 A1 | 12/2002 | Bojarczuk, Jr. et al. ... 257/310 |
| 2003/0082863 A1 | 5/2003 | Lim et al. | |
| 2003/0119292 A1 | 6/2003 | Lee et al. | |
| 2003/0122199 A1 * | 7/2003 | Koyama et al. ........ 257/369 |
| 2004/0099916 A1 | 5/2004 | Rotondaro et al. | |
| 2005/0064663 A1 * | 3/2005 | Saito ................. 438/275 |
| 2005/0067704 A1 * | 3/2005 | Kaneko et al. ......... 257/758 |
| 2005/0280104 A1 | 12/2005 | Li | |

FOREIGN PATENT DOCUMENTS

DE 10 2005 024 417 A1 2/2006

(Continued)

OTHER PUBLICATIONS

Cellere et al. "Heavy ion irradiation of Floating Gate memory cells" *IEEE Conference on Integrated Circuit Design and Technology* 187-(2004).

(Continued)

*Primary Examiner*—Bradley K Smith
*Assistant Examiner*—Amar Movva
(74) *Attorney, Agent, or Firm*—Myers Bigel Sibley & Sajovec, P.A.

(57) ABSTRACT

Integrated circuit devices include a semiconductor substrate having a first doped region and a second doped region having a different doping type than the first doped region. A gate electrode structure on the semiconductor substrate extends between the first and second doped regions and has a gate insulation layer of a first high dielectric constant material in the first doped region and of a second high dielectric constant material, different from the first high dielectric constant material, in the second doped region. A gate electrode is on the gate insulation layer.

11 Claims, 13 Drawing Sheets

FOREIGN PATENT DOCUMENTS

KR        10-0516991        12/2003

OTHER PUBLICATIONS

Min et al. "Low-Frequency Noise in Submicrometer MOSFETs With $HfO_2/Al_2O_3$ and $HfAlO_x$ Gate Stacks" *IEEE Transactions on Electron Devices* 51(10):1679-1687 (2004).

Okada et al. "Model for Dielectric Breakdown Mechanism of $HfAlO_x/SiO_2$ Stacked Gate Dielectrics Dominated by the Generated Subordinate Carrier Injection" *IEEE* 30.3.1-30.3.4 (2004).

Sim et al. "Hot carrier stress study in Hf-silicate NMOS transistors" *IRW Final Report* 136-140 (2004).

Wang et al. "Electrical Performance Improvement in $SiO_2$/HfSiO High-k Gate Stack for Advanced Low Power Device Application" *IEEE International Conference on Integrated Circuit Design and Technology* 283-286 (2004).

Notice to Submit Response in Korean Application No. 10-2005-0032033; Date of mailing Jun. 8, 2006.

English translation of Notice to Submit Response in Korean Application No. 10-2005-0032033; Date of mailing Jun. 8, 2006.

English translation of Notice to Submit Response in Korean Application No. 10-2005-0032033; Date of mailing Dec. 22, 2006.

Koyama et al., "Effects of Nitrogen in HfSiON Gate Dielectric on the Electrical and Thermal Characteristics", IEEE International Electron Device Meeting, 2002 Technical Digest, Dec. 11, 2002, pp. 849-852.

Morioka et al., "High mobility MISFET with low trapped charge in HFSiO films," 2003 Symposium on VLSI Digest of Technical Papers, Jun. 10-12, 2003, pp. 165-166.

Jung et al., "Improved Current Performance of CMOSFETs with Nitrogen Incorporated $HfO_2$-$Al_2O_3$ Laminate Gate Dielectric," IEEE International Electron Device Meeting 2002, Dec. 8-11, 2002, pp. 853-856.

Ota et al., Comparative Study of Carrier Mobility and Threshold Voltage between N- and P-MOSFETs in TaN Gate CMOS with EOT=1.5-2 $HfAlO_x$, International Workshop on Gate Insulator 2003, Nov. 6-7, 2003, pp. 158-163.

Office Action for German Patent Application No. 10 2005 014 619. 8-33; Date of mailing Aug. 17, 2006.

Yeo et al "Effects of High-*k* Gate Dielectric Materials on Metal and Silicon Gate Workfunctions" *IEEE Electron Devices Letters* 23(6):342-344.

Office Action not submitted.

\* cited by examiner

DUAL GATE STACK CMOS STRUCTURE WITH DIFFERENT DIELECTRICS

CROSS-REFERENCE TO RELATED APPLICATION

This application is related to and claims priority from Korean Patent Application No. 2004-0051852, filed on Jul. 5, 2004, the disclosure of which is hereby incorporated herein by reference in its entirety.

BACKGROUND OF THE INVENTION

The present invention relates to integrated circuit devices and, more particularly, to gate structures of integrated circuit devices and methods of forming the same.

It is known to provide gate structures for MOS field effect transistors using a polysilicon layer gate and a silicon dioxide gate dielectric between the polyilicon layer and the underlying semiconductor substrate. However, MOS field-effect transistors with very thin gate dielectrics made from silicon dioxide may experience unacceptable gate leakage currents. If the thickness of the silicon dioxide gate dielectric is less than about 40 angstroms (Å), direct tunneling may occur through the gate dielectric to the underlying channel region, which may increase leakage current and power consumption.

Forming the gate dielectric from certain high-k dielectric materials, in place of silicon dioxide, can reduce gate leakage. For high dielectric constant (high-k or high-$\in$) materials used for the gate dielectric layer, the high permitivity ($\in$) of the material generally results in an increase in the gate-to-channel capacitance. The capacitance is generally characterized as $C=\in A/t_{ox}$. As such, a gate dielectric having a higher $\in$ may allow use of thicker gate dielectric (i.e., $t_{ox}$ greater than 40 angstroms) and greater capacitance and device speed may be provided with less leakage current.

One potential disadvantage of using high-k dielectric materials for gate dielectric layers in integrated circuit (IC) devices is that the high dielectric materials generally contain a greater number of bulk traps and interface traps than thermally grown silicon dioxide ($SiO_2$). These traps typically affect threshold voltage (Vt) operation of the transistor. In addition, high gate depeletion of a polysilicon gate electrode may result compared to a silicon dioxide or silicon oxynitride (SiON) gate dielectric. In addition, there may be degradation of bias temperature instability (BTI) characteristics of the transistor and mobility degradation as compared to the silicon dioxide or silicon oxynitride gate dielectric structure. With respect to BTI characteristics of a transistor, negative BTI (NBTI) for a PMOS transistor or positive BTI (PBTI) for a NMOS transistor provide a reliability test for thin film quality.

SUMMARY OF THE INVENTION

Embodiments of the present invention include integrated circuit devices including a semiconductor substrate having a first doped region and a second doped region having a different doping type than the first doped region. A gate electrode structure on the semiconductor substrate extends between the first and second doped regions and has a gate insulation layer of a first high dielectric constant material in the first doped region and of a second high dielectric constant material, different from the first high dielectric constant material, in the second doped region. A gate electrode is on the gate insulation layer.

In some embodiments of the present invention, the first doped region includes a NMOS device and the second doped region includes a PMOS device and the gate insulation layer of the first high dielectric constant material is on a channel region of the NMOS device and the gate insulation layer of the second high dielectric constant material is on a channel region of the PMOS device. The first high dielectric constant material may be a metal oxide including hafnium, zirconium and/or titanium and the second high dielectric constant material may be a metal oxide including aluminum, lanthanium and/or yittrium. The first high dielectric material may be hafnium oxide, hafnium silicon oxide, zirconium oxide, zirconium silicon oxide, hafnium oxynitride, hafnium silicon oxynitride, zirconium oxynitride and/or zirconium silicon oxynitride. The second high dielectric material may be aluminum oxide, hafnium aluminum oxide, lanthanium oxide, hafnium lanthanium oxide, zirconium aluminum oxide, aluminum oxynitride, hafnium aluminum oxynitride, lanthanium oxynitride, hafnium lanthanium oxynitride and/or zirconium aluminum oxynitride. The first high dielectric material may be hafnium silicon oxide or hafnium silicon oxynitride and the second high dielectric material may be hafnium aluminum oxide and/or hafnium aluminum oxynitride.

In further embodiments of the present invention, the first and second gate electrodes are multi-layer structures including a metal layer or metal nitride layer and a polysilicon layer. The gate electrode structure may include a fence structure over an isolation region between the first and second doped regions. The fence structure may include a layer of one of the first or second high dielectric constant materials extending away from the semiconductor substrate into the gate electrode. The gate electrode structure may extend from a channel region of a NMOS device in the first doped region to a channel region of a PMOS device in the second doped region and the gate electrode structure may include a fence structure between the channel region of the NMOS device and the channel region of the PMOS device, the fence structure including a layer of one of the first or second high dielectric constant materials extending away from the semiconductor substrate into the gate electrode.

In other embodiments of the present invention, integrated circuit devices include a semiconductor substrate having a first doped region and a second doped region having a different doping type than the first doped region. A first gate electrode structure is provided on the semiconductor substrate in the first doped region. The first gate electrode structure includes a first gate insulation layer on the semiconductor substrate, the first gate insulation layer comprising a first high dielectric constant material, and a first gate electrode on the first gate insulation layer. A second gate electrode structure is provided on the semiconductor substrate in the second doped region. The second gate electrode structure includes a second gate insulation layer on the semiconductor substrate, the second gate insulation layer including a second high dielectric constant material different from the first high dielectric constant material, and a second gate electrode on the second gate insulation layer.

In further embodiments of the present invention, the first doped region includes a NMOS device and the second doped region includes a PMOS device and the first gate insulation layer is on a channel region of the NMOS device and the second gate insulation layer is on a channel region of the PMOS device. The first and second gate electrode structures may be a single electrode structure extending between the NMOS and PMOS devices and the single electrode structure may extend across an isolation region between the first and second doped regions with the first and second electrodes comprising a common gate electrode. The single electrode structure may include a fence structure over the isolation region including a layer of one of the first or second high dielectric constant materials extending away from the semiconductor substrate into the common gate electrode.

In other embodiments of the present invention, methods of forming an integrated circuit device include providing a semiconductor substrate including a first doped region and a second doped region. A first gate insulating layer of a first high dielectric constant material is formed on the semiconductor substrate extending between the first and second doped regions. A first gate conductor layer is formed on the first gate insulating layer. The first gate conductor layer and the first gate insulating layer in the second doped region are removed. A second gate insulating layer of a second high dielectric constant material is formed on the first gate conductor layer in the first doped region and on the semiconductor substrate with the first gate conductor layer removed therefrom in the second doped region. A second gate conductor layer is formed on the second gate insulating layer. The semiconductor substrate is etched and/or polished with the second gate conductor layer thereon to a depth sufficient to remove the second gate insulating layer in the first doped region and a third gate conductor layer is formed on the second gate conductor layer.

In further embodiments of the present invention, forming a first gate conductor layer is preceded by forming a metal layer on the first gate insulating layer and removing the first gate conductor layer and the first gate insulating layer in the second doped region includes removing the metal layer in the second doped region. Forming a second gate conductor layer may be preceded by forming a metal layer on the second gate insulating layer. The metal layer may be molybdenum, titanium, tantalum, hafnium, zirconium, aluminum, tungsten, tantalum silicide, tantalum aluminum, titanium silicide, titanium aluminum and/or nitrides thereof. Forming the metal layer may include forming the metal layer to a thickness of less than about 200 angstroms (Å). The metal layer may be formed to a thickness of between about 1 angstrom (Å) and about 50 Å.

In some embodiments of the present invention, forming a first gate insulating layer is preceded by forming an isolation region between the first and second doped regions. Forming a first gate insulating layer may be preceded by forming an interface layer on the semiconductor substrate and forming a first gate insulating layer may then include forming a first gate insulating layer on the interface layer. The first and second gate conductor layers may be polysilicon. The second high dielectric constant material may be different from the first high dielectric constant material.

In other embodiments of the present invention, the first doped region is a p-type doped region and the second doped region is a n-type doped region and forming a first gate insulating layer of a first high dielectric constant material on the semiconductor substrate extending between the first and second doped regions includes depositing a metal oxide including at least one of hafnium, zirconium or titanium and then nitridation annealing the deposited metal oxide. Forming a second gate insulating layer of a second high dielectric constant material may include depositing a metal oxide including at least one of aluminum, lanthanium or yittrium and then nitridation annealing the deposited metal oxide.

In yet further embodiments of the present invention, n-type doped source and drain regions are formed in the first doped region with the first gate electrode structure extending over a channel region therebetween and p-type doped source and drain regions are formed in the second doped region with the second gate electrode structure extending therebetween. Etching and/or polishing the semiconductor substrate may include polishing the second gate conductor layer to a depth where the second gate insulating layer is still not exposed in the first doped region and then etching the polished gate conductor layer and the second gate insulating layer to remove the second gate insulating layer in the first doped region. Removing the first gate conductor layer may further include removing the first gate conductor layer in the first doped region to a thickness of the first gate conductor layer less than half of a total thickness of the first and third gate conductor layers or the second and third gate conductor layers.

In other embodiments of the present invention, integrated circuit devices include a semiconductor substrate having a p-type doped region including an NMOS device. A gate electrode structure of the NMOS device on the semiconductor substrate has a gate insulation layer of a high dielectric constant material that is a metal oxide including at least one of hafnium, zirconium or titanium.

In yet further embodiments of the present invention, integrated circuit devices include a semiconductor substrate having a n-type doped region including a PMOS device. A gate electrode structure of the PMOS device on the semiconductor substrate has a gate insulation layer of a high dielectric constant material that is a metal oxide including at least one of aluminum, lanthanium or yittrium.

BRIEF DESCRIPTION OF THE DRAWINGS

The present invention will now be described with reference exemplary embodiments illustrated in the attached drawings in which.

DETAILED DESCRIPTION OF THE INVENTION

Figure 1:
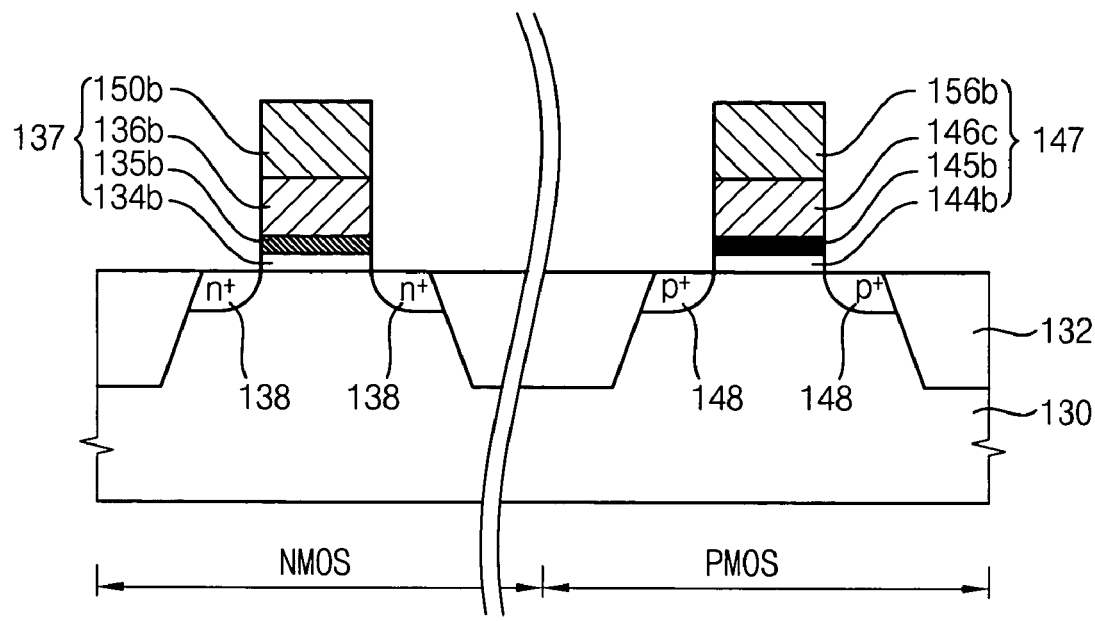
FIG. 1 is a cross-sectional view illustrating a gate structure of an integrated circuit device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Various embodiments of the present invention will now be described with reference to FIGS. 1 and 2. FIG. 1 is a cross-sectional view illustrating a gate structure for an integrated circuit device according to some embodiments of the present invention. The cross-section of FIG. 1 is taken in a length direction as indicated for the PMOS structure by line AA' in FIG. 5 and for the NMOS structure by the line CC' in FIG. 5. As shown in FIG. 1, a semiconductor substrate 130 includes isolation regions 132 therein. The isolation regions 132 may separate NMOS and PMOS active regions of the integrated circuit device. The isolation regions 132 may be, for example, deep trench isolation regions. Referring now to the NMOS region on the left side of FIG. 1, a transistor device is shown including n-type source/drain regions 138 with a channel region extending therebetween. A gate structure 137 is formed on the channel region between the source/drain regions 138. The gate electrode structure 137 for the embodiments illustrated in FIG. 1 includes a first gate insulation (insulating) or gate dielectric layer 134b. A metal inserted polysilicon (MIPS) gate electrode is formed on the gate insulation layer 134b for the illustrated embodiments of FIG. 1. The gate electrode includes the metal (or metal nitride) gate conductor layer 135b and a conductive polysilicon gate conductor layer, illustrated as a first polysilicon layer 136b and a second polysilicon layer 150b. The polysilicon layers may be doped or the like to provide a conducting path, along with the metal layer 135b, for the gate electrode.

Similarly, for the PMOS active region illustrated on the right in FIG. 1, p-type source/drain regions 148 are formed in the semiconductor substrate 130 with a channel region extending therebetween. A gate electrode structure 147 is formed on the channel region between the source/drain regions 148. The gate electrode structure 147 includes a gate insulation (or insulating) or gate dielectric layer 144b on the semiconductor substrate 130. As with the NMOS side structure described previously, the PMOS side structure shown in the embodiments of FIG. 1 includes a multilayer gate electrode on the gate insulation layer 144b. The gate electrode in the PMOS region of FIG. 1 includes a metal (or metal nitride) layer 145b and two gate conductive layers, such as doped polysilicon layers 146c, 156b.

For the gate electrode structure 137 extending between the doped source/drain region 138, the gate insulation layer 134b is formed of a first high dielectric constant material that may be selected based on the doping used in the NMOS doped region. In some embodiments of the present invention, for the gate electrode structure 147 in the PMOS doped region, the gate insulation layer 144b is formed of a second high dielectric constant material that is different from the first high dielectric constant material.

In some embodiments of the present invention, the high dielectric material of the gate insulation layer 134b for the NMOS gate electrode structure includes one or more of hafnium, zirconium or titanium and the second high dielectric constant material for the gate insulation layer 144b of the PMOS device is a metal oxide including one or more of aluminum, lanthanium or yittrium. In some embodiments of the present invention the first high dielectric material includes at least one of hafnium oxide, hafnium silicon oxide, zirconium oxide, zirconium silicon oxide, hafnium oxynitride, hafnium silicon oxynitride, zirconium oxynitride or zirconium silicon oxynitride and the second high dielectric material includes at least one of aluminum oxide, hafnium aluminum oxide, lanthanium oxide, hafnium lanthanium oxide, zirconium aluminum oxide, aluminum oxynitride, hafnium aluminum oxynitride, lanthanium oxynitride, hafnium lanthanium oxynitride or zirconium aluminum oxynitride. The first high dielectric material in other embodiments may be hafnium silicon oxide and/or hafnium silicon oxynitride and the second high dielectric material is hafnium aluminum oxide and/or hafnium aluminum oxynitride.

As described with reference to the embodiments of FIG. 1, the gate electrode structures 137, 147 are both multilayer structures including a metal (or metal nitride) gate conductor layer and a polysilicon gate conductor layer. However, it will be understood that the present invention is not limited to such a gate electrode structure and that the gate electrode structure may be, for example, other known types of conductive electrode structures, such as a polysilicon gate electrode.

Further embodiments of the present invention will now be described with reference to the cross-sectional illustration of FIG. 2. As with the illustration of FIG. 1, the cross-sectional view of FIG. 2 is taken in a length direction corresponding to lines AA' and CC' of FIG. 5 for PMOS and NMOS regions respectively. As with the embodiments of FIG. 1, the embodiments of FIG. 2, include various common regions between the embodiments, which are given the same numbered notation in each of FIGS. 1 and 2. Such features will not be further discussed with reference to the embodiments of FIG. 2. The embodiments of FIG. 2 differ from those of FIG. 1 in that the gate electrode shown in the PMOS region of the embodiments of FIG. 2 includes a single layer gate conducting layer 160b on the metal layer 145b. Furthermore, the gate conducting layer 160b is shown as patterned to form a portion of the gate electrode structure in the NMOS as well as the PMOS region.

Figure 2:
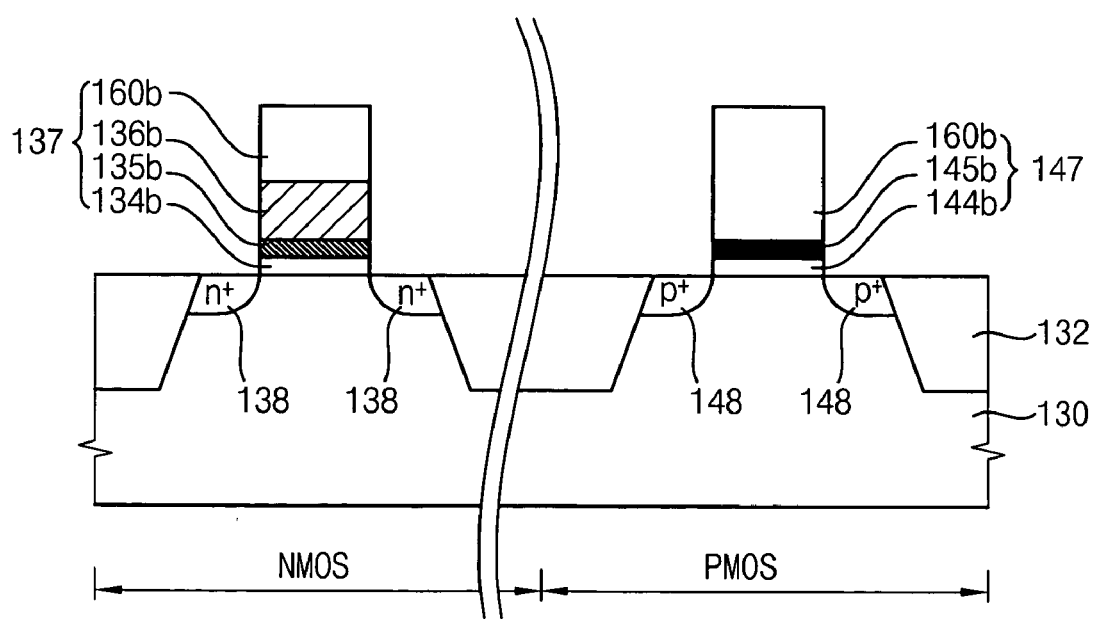
FIG. 2 is a cross-sectional view illustrating a gate structure of an integrated circuit device according to further embodiments of the present invention.
Figure 4:
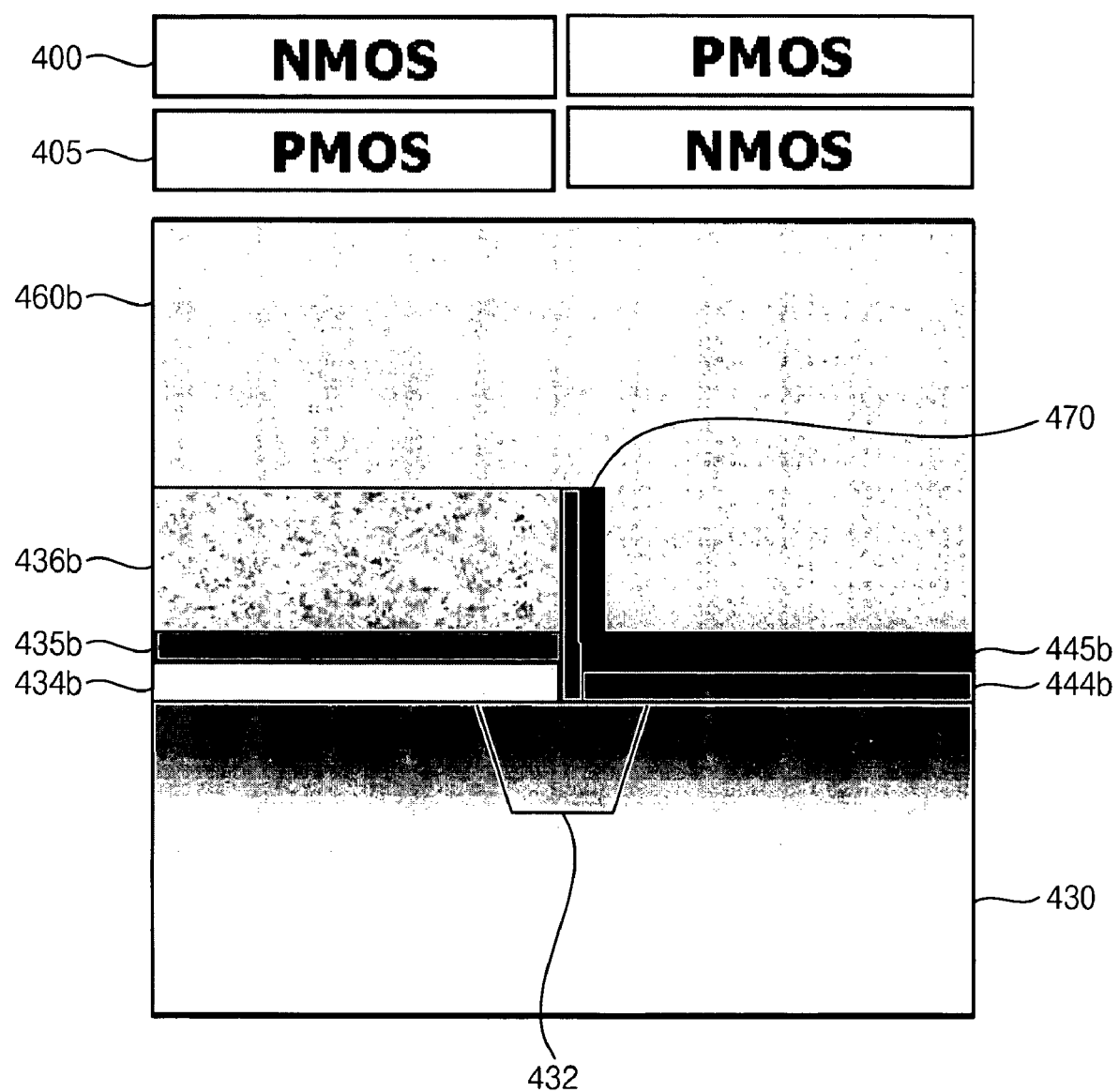
FIG. 4 is a cross-sectional schematic diagram illustrating a structure along a width direction of the device of FIG. 2.
Figure 5:
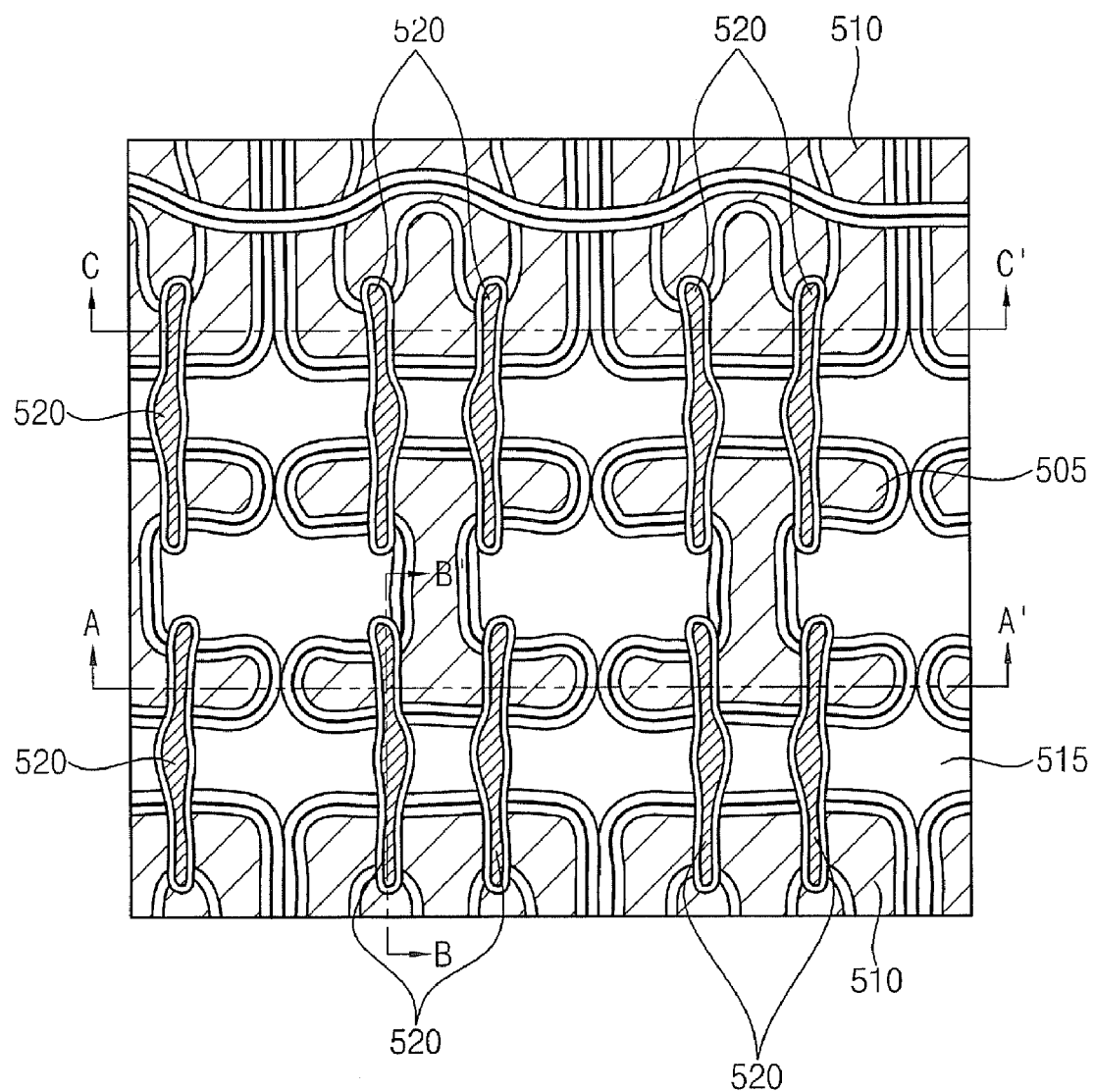
FIG. 5 is a top planar view of an integrated circuit device according to some embodiments of the present invention.

While the respective NMOS and PMOS region gate structures appear as and have been discussed as distinct structures with reference to the embodiments of FIG. 1 and FIG. 2, it will be understood from consideration of the top planer view of FIG. 5 that the respective differing NMOS and PMOS structures may be regions of a single gate structure 520 extending in a direction that will be referred to herein as a width indicated by the reference BB' in FIG. 5. The structure of such embodiments in the width direction will now be further described with reference to particular embodiments thereof illustrated in FIGS. 3 and 4. The embodiments in FIG. 3 generally correspond to the cross-sectional illustration of FIG. 1 and those of FIG. 4 to the cross-sectional illustration of FIG. 2. More particularly, FIG. 3 corresponds to the illustration of FIG. 1, where the relationship between the NMOS and PMOS regions are as indicated at reference 300, with the NMOS region to the left and the PMOS to the right. However, as indicated at reference 305 of FIG. 3, the PMOS structure may be arranged as generally described with reference to the layers of the NMOS structure of FIG. 1 and vice-versa. For the purposes of the description herein, the embodiments of FIG. 3 will be described with reference to the NMOS and PMOS arrangement shown at reference 300 of FIG. 3. Similarly for FIG. 4, the embodiments illustrated therein will be described with reference to the respective first and second type doping active regions as shown at reference 400 to correspond with their presentation in FIG. 2, although the alternative arrangement shown with respect to reference 405 may also be utilized in further embodiments of the present invention. In describing FIG. 3, similar reference numbers will be utilized for various embodiments of the layers illustrated therein to facilitate reference to the corresponding elements of FIG. 1 (i.e., 136b corresponds to 336b, etc.). Various layers in FIG. 4 will be likewise notated for reference to various structures previously described with reference to FIG. 2.

Figure 3:
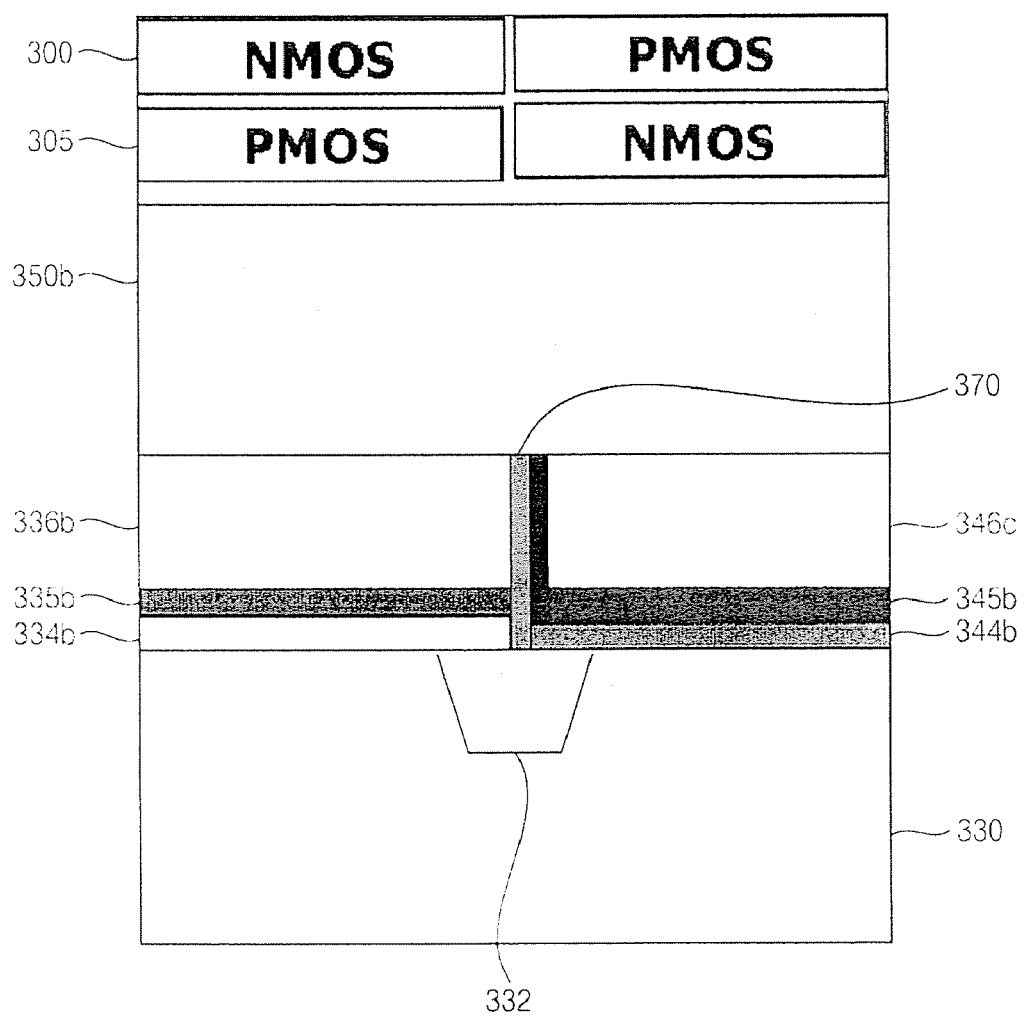
FIG. 3 is a cross-sectional schematic diagram illustrating a structure along a width direction of the device of FIG. 1.

Referring now to the embodiments of FIG. 3, a semiconductor substrate 330 includes an isolation region 332, such as a deep trench isolation region, therein between the respective first doped and second doped active regions, referred to as NMOS or PMOS regions at reference numbers 300 and 305, for various embodiments of the present invention. A first gate insulation layer 334b is formed on the first doped region of the semiconductor substrate 330. A first gate electrode is formed on the first gate insulation layer 334b including, in the illustration of FIG. 3, a multilayer structure of a metal (or metal nitride) layer 335b, a first polysilicon layer 336b and what is indicated as the third polysilicon layer 350b in FIG. 3. The first gate electrode structure in the NMOS doped region of FIG. 3 is, thereby, provided including: the first gate insulation layer 334b; the metal nitride layer 335b; and the polysilicon conductive layers 336b and 350b.

The gate electrode structure in the PMOS region on the right side of FIG. 3 will now be described. A second gate insulation layer 344b is formed on the semiconductor substrate 330. In some embodiments of the present invention, the second gate insulation layer 344b is formed of a different high dielectric constant material than the first gate insulation layer 334b. A second gate electrode structure is formed on the second gate insulation layer 344b, shown as a multilayer structure in FIG. 3, including: a metal (or metal nitride) layer 345b; a second polysilicon layer 346c and the third polysilicon layer 350b.

As further seen in the embodiments of FIG. 3, and with reference to the top planer view of the gate structure 520 in FIG. 5, the gate electrode structure of FIG. 3 extends between the first and second doped regions over an isolation region 332 between the first and second doped active regions. The gate structure 520 includes a fence structure 370 over the isolation region 332 between the first and second doped active regions (which may be NMOS and PMOS or PMOS and NMOS with reference to the illustration of FIG. 3 as shown at reference numbers 300 and 305). The fence structure 370 may include a layer of one of the high dielectric constant materials of the gate insulation layers 334B, 344B extending away from the semiconductor substrate 330 into the gate electrode structure 520. As shown in FIG. 3, the fence structure 370 includes a layer of the high dielectric constant material of the second gate insulation layer 344b. The fence structure 370 of the embodiments of FIG. 3 further includes a layer of the material of the second metal layer 345b. As can further be seen by referring to the cross sectional illustration of FIG. 1 and that of FIG. 3, the gate electrode structure, in some embodiments of the present invention, extends from a channel region of a NMOS device on the first doped region to a channel region of a PMOS device in the second doped region. While shown over the isolation region 332 in FIG. 3, in some other embodiments of the present invention, the fence structure 370 may be positioned between the channel regions of the respective NMOS device and PMOS device at a position other than over an isolation region 332.

Referring now to the cross-sectional width illustration of FIG. 4, FIG. 4 generally illustrates corresponding features as described with reference of FIG. 3 but for the embodiments illustrated in cross-sectional (length) view in FIG. 2. FIG. 4 will be described with reference to the arrangement as indicated with reference number 400 with an NMOS region to the left and a PMOS region to the right to correspond to the arrangement shown in FIG. 2. However, it will be understood that, in other embodiments of the present invention, the doped PMOS device active region may include the gate structure illustrated on the left in FIG. 4 and the NMOS region may include the gate structure illustrated on the right, as indicated at reference number 405.

As shown in FIG. 4, the semiconductor substrate 430 includes an isolation region 432, such as a deep trench isolation region, therein between the NMOS and PMOS device type doped active regions. The gate electrode structure in the NMOS region includes the first gate insulation layer 434b of a first high dielectric constant material formed on the semiconductor substrate 430 for the first gate electrode thereon. A multilayer gate electrode is shown formed on the first gate insulation layer 434b in the embodiments of FIG. 4. The gate electrode includes a metal (or metal nitride) layer 435b with a first conductive polysilicon layer 436b and a second conductive polysilicon layer 460b formed thereon. In the PMOS region, a second high dielectric constant gate insulation layer 444b is formed on the semiconductor substrate 430 with a multilayer gate electrode formed thereon. The gate electrode in the PMOS region for the embodiments as shown in FIG. 4 includes a metal (or metal nitride) layer 445b and the second conductive polysilicon layer 460b formed thereon. A fence structure 470 extends away from the semiconductor substrate 430 over the insulation region 432. The fence structure 470 illustrated in the embodiments of FIG. 4 includes a high dielectric constant material layer formed by the second gate insulation layer 444b and a metal layer formed by the metal (or metal nitride) layer 445b.

Referring now to the top planar view of FIG. 5, a plurality of active regions of integrated circuit devices with gates extending between first and second doped types of active region are shown. The gates 520 extend between PMOS active regions 505 and NMOS active regions 510. Isolation regions 515 are shown in lighter shade in FIG. 5 than the active regions 505, 510.

Methods of forming an integrated circuit device including a gate electrode structure having a high dielectric constant material layer will now be described with reference to the cross sectional illustrations of FIGS. 6A through 6H. As seen in FIG. 6H, the method described with reference to FIGS. 6A through 6H may be utilized to result in the structure described previously with reference to FIG. 1. However, it will be understood that the embodiments of structure as described with reference to FIG. 2 may be similarly provided with appropriate modification to the methodologies to be described with reference to FIGS. 6A through 6H.

Figure 6A:
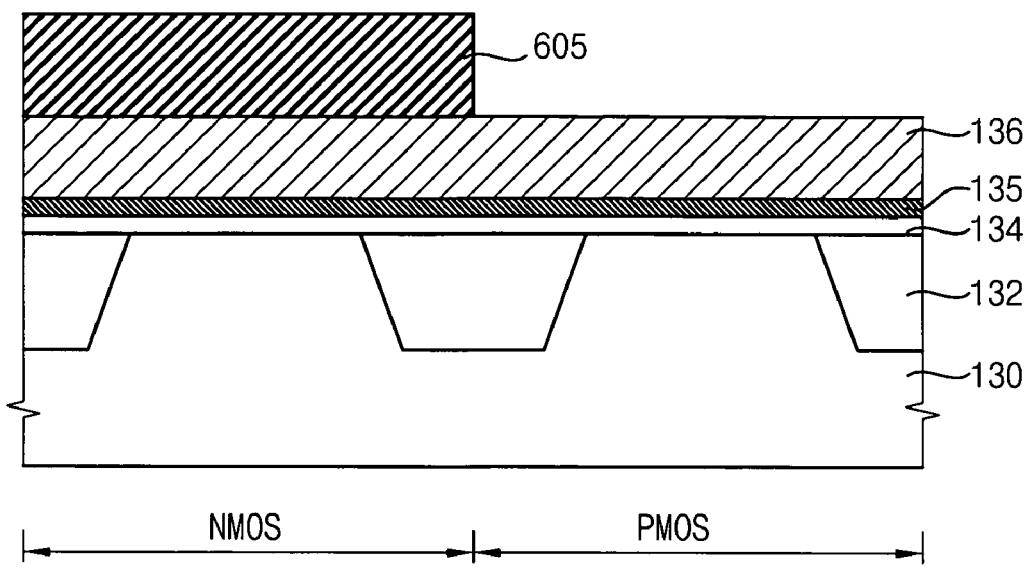
FIGS. 6A to 6I are cross-sectional diagrams illustrating methods for making a gate structure in an integrated circuit device according to some embodiments of the present invention.

Referring now to FIG. 6A, a trench isolation region 132 is formed in the semiconductor substrate 130. A first gate insulation layer 134 is formed on the semiconductor substrate 130. A first gate insulation layer 134 may be formed, for example, by chemical vapor deposition (CVD) or atomic layer deposition (ALD). It will also be understood that the first gate insulation layer 134 may not be formed directly on the semiconductor substrate 130 and that an interface layer, such as silicon dioxide ($SiO_2$) or silicon oxynitride (SiON) layer, may be formed between the substrate 130 and the first gate insulation layer 134. As further illustrated for the embodiments in FIG. 6A, a first metal (or metal nitride) layer 135 is formed on the first gate insulation layer 134. The first metal (or metal nitride) layer 135 may be formed of molybdenum (Mo), molybdenumnitride (MoN), titanium (Ti), titanium nitride (TiN), tantalum (Ta), tantalum nitride (TaN), hafnium (Hf), hafnium nitride (HfN), zirconium (Zr), zirconium nitride (ZrN), aluminum (Al), aluminum nitride (AlN), tantalum silicon nitride (TaSiN), or the like. In some embodiments of the present invention, the first metal layer 135 is formed to a thickness of less than about 200 angstroms (Å). It will further be understood that the metal layer or metal nitride layer 135 may be omitted for embodiments utilizing a polysilicon conductive electrode rather than a MIPS electrode. A first gate conductive layer 136 is formed on the first metal layer 135. The first gate conductive layer 136 may be, for example, doped polysilicon or a multilayer structure of polysilicon and metal nitride or the like.

Figure 6B:
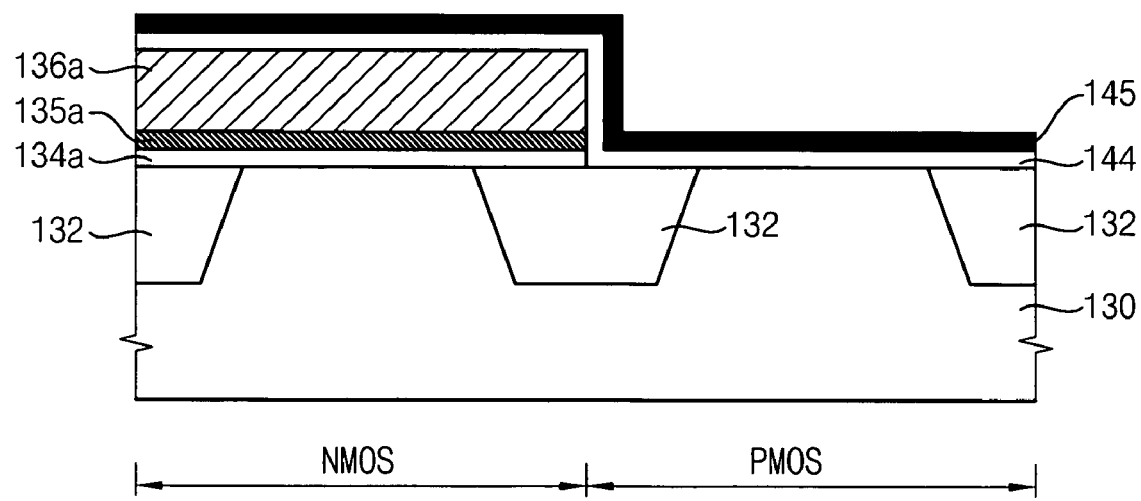

As also shown in FIG. 6A, a photoresist pattern 605 is formed on the gate conductive layer 136. The integrated circuit device is then processed, for example, by dry or wet etching. As a result of the etching, a patterned first conductive layer 136a, first gate insulation layer 134a and first-metal layer 135a are formed as seen in FIG. 6B. As also shown in the embodiments of FIG. 6B, a second gate insulation layer 144 is formed on the first conductive layer pattern 136a and along the surface of the semiconductor substrate 130 in the PMOS region. As discussed above, the second gate insulation layer 144 may be formed of a second high dielectric constant material different from that used for the first gate insulation layer 134a. The second metal (or metal nitride) layer 145 may be formed of the same material or a different material from that used for forming the first metal layer 135. Also, as discussed with reference to the first metal layer 135, shown as patterned metal layer 135a in FIG. 6B, the second metal layer 145 may be omitted in embodiments where a MIPS electrode is not utilized.

Further details for formation of a gate insulation layer 144 will now be described with reference to a particular high dielectric materials. A method for forming an HFSiO layer as a gate insulation layer will now be described. For this particular example, a CVD process is used with an Hf source, an Si source and an oxygen source at about 400° C. to about 500° and at a pressure of about 1 to about 5 Torr. The Hf source may be $HfCl_4$, the Si source may be $DCS(SiH_2Cl_2)$, $SiH_4$ and/or a mixture thereof and the oxygen source may be $O_2$, $O_3$ and/or an oxygen radical. An ALD process may be used with an Hf source, an Si source and an oxygen source at about 150° C. to about 500° C. and at a pressure of about 0.1 to about 5 Torr. In such a process, the Hf source may be $Hf(OtBu)_4$, $Hf(NEtMe)_4$, $Hf(MMP)_4$, $Hf(NEt_2)_4$, $Hf(NMe_2)$. The Si source may be TDMAS (tetra-dimethyl-aminosilicon) and the oxygen source may be $H_2O$, $H_2O_2$, $O_3$, $O_2$ plasma and/or $D_2O$. As a more particular example, the formation of the HfSiO layer may be performed at about 300° C. and at a pressure of about 1 Torr. The process may include, in this particular example, $Hf(OtBu)_4$ 1 s (chemical absorped layer formation), Ar 1 s (physical absorped layer removal), $O_3$ 3 s, Ar 3 s (unreacted $O_3$ removal), TDMAS 1 s (chemical absorped layer formation), Ar 1 s (physical absorped layer removal), $O_3$ 3 s, Ar 3 s (unreacted $O_3$ removal), with repetition to form a layer having a height of about 10 Å. Nitridation annealing may be performed after the insulating layer is formed.

A method for forming an HfAlO layer as a gate insulation layer will now be described. For this particular example, an ALD process with an Hf source, an Al source and an oxygen source at about 200° C. to about 500° C. and at a pressure of about 0.1 to about 5 Torr may be used. The Hf source and the oxygen source may be as described above and the Al source may be TMA (trimethyl aluminium), $AlCl_3$, $AlH_3N(CH_3)_3$, $C_6H_{15}AlO$, $(C_4H_9)_2AlH$, $(CH_3)_2AlCl$, $(C_2H_5)_3Al$ and/or $(C_4H_9)_3Al$. As a more particular example, the formation may be at about 300° C. and at a pressure of about 1 Torr. The process may include, in this particular example, $Hf(OtBu)_4$ 1 s (chemical absorped layer formation), Ar 1 s (physical absorped layer removal), $O_3$ 3 s, Ar 3 s (unreacted $O_3$ removal), TMA 1 s (chemical absorped layer formation), Ar 1 s (physical absorped layer removal), $O_3$ 3 s, Ar 3 s (unreacted $O_3$ removal), with repetition to form a layer having a height of about 10 Å. Nitridation annealing may be performed after the insulating layer is formed.

Figure 6C:
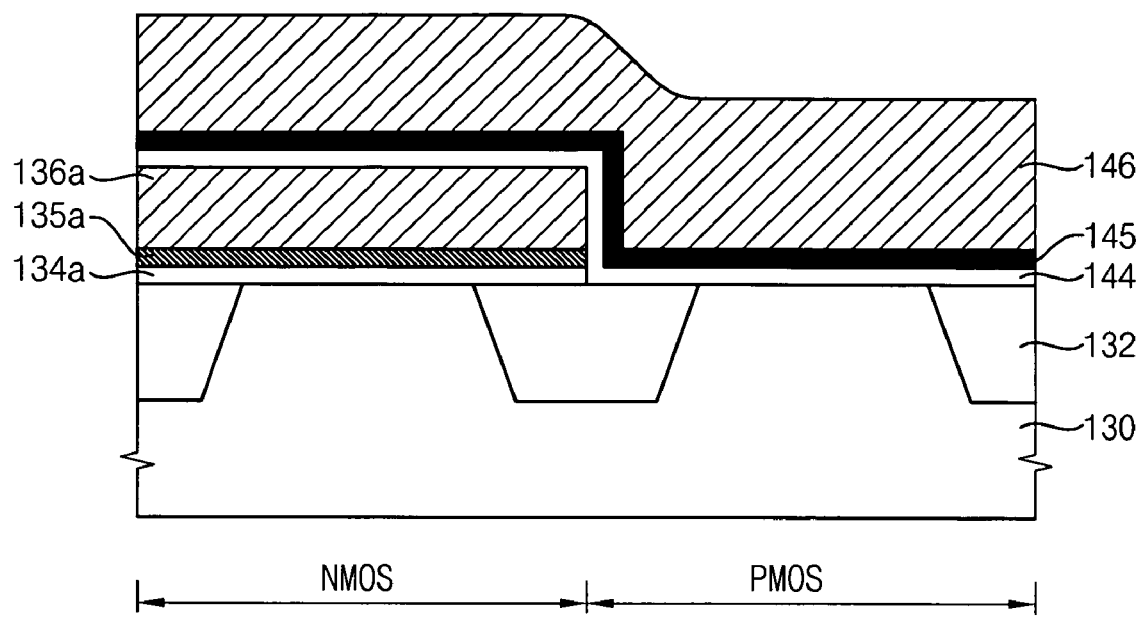

Referring now to FIG. 6C, further operations related to forming an integrated circuit device with a gate electrode structure according to some embodiments of the present invention will now be described. In particular, FIG. 6C illustrates the formation of the second gate conductive layer 146 in both the NMOS and PMOS regions of the gate electrode structure. The second gate conductive layer may be doped polysilicon or a multilayer structure of polysilicon and a metal nitride or the like in various embodiments of the present invention. As seen in FIG. 6C, a height difference results in the regions shown as the NMOS and PMOS regions due to the step pattern of the deposited second gate insulation layer 144 and the metal (or metal nitride) layer 145 over the patterned and not etched layers 134a, 135a and 136a in the NMOS region. In some embodiments of the present invention, the stepped height differential is less than about 500 angstroms (Å).

Figure 6D:
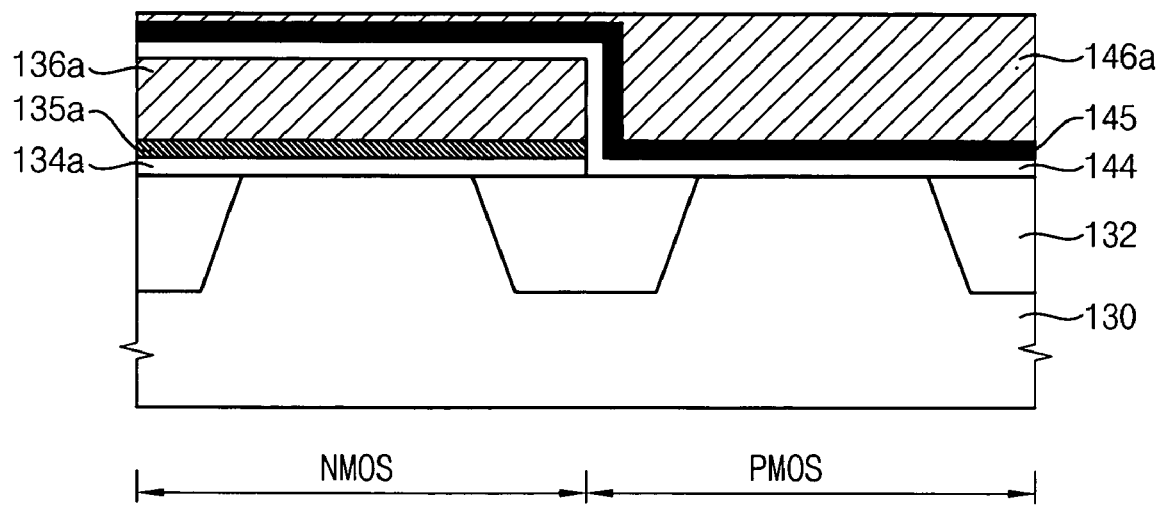

As shown in FIG. 6D, the second conductive (conductor) layer 146 is processed, for example, by chemical mechanical polishing (CMP), to form a lowered second gate conductive layer 146a. In particular embodiments of the present invention, the second gate conductive layer 146 is lowered by etching rather than chemical mechanical polishing and, in further embodiments, by a combination by chemical mechanical polishing and etching. In such embodiments, the chemical mechanical polishing may leave some amount of the second gate conductor layer 146 on the metal layer 145 in the NMOS region by polishing the second gate conductor layer 146 to a depth where the second gate insulating layer 145 is still not exposed in the NMOS device type doped region.

Figure 6E:
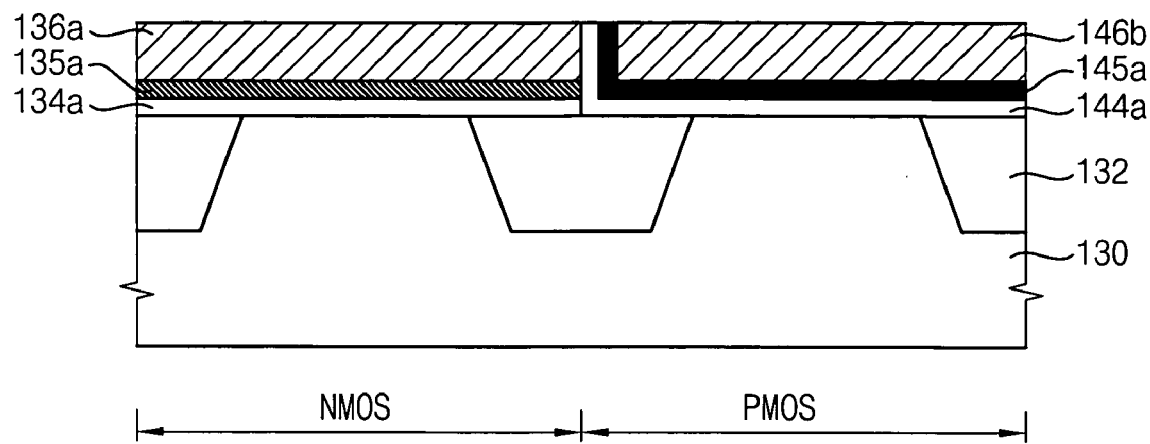

As shown in FIG. 6E, the gate structure is further processed, for example, by dry etch back, to result in the second gate conductive pattern 146B in the PMOS region and to remove the metal layer 145 and the second gate insulation layer 144 from the NMOS region to define the patterned corresponding layers 144a and 145a in the PMOS region. The second conductive pattern 146a may have a thickness of no more than 500 angstroms (Å) in some embodiments of the present invention.

The metal layers 135, 145 may be formed to a thickness of less than about 200 angstroms (Å). In other embodiments of the present invention, the metal layers 135, 145 may be formed to a thickness of between about 1 angstroms (Å) and about 50 angstroms (Å).

In some embodiments of the present invention, the first gate insulation layer 134a of the first high dielectric constant material is formed by depositing a metal oxide including one or more of hafnium, zirconium or titanium and then nitridation annealing the deposited metal oxide. The second gate insulation layer 144a of the second high dielectric constant material may be formed by depositing a metal oxide including one or more of aluminum, lanthanium, or yittrium and then nitridation annealing the deposited metal oxide.

Figure 6F:
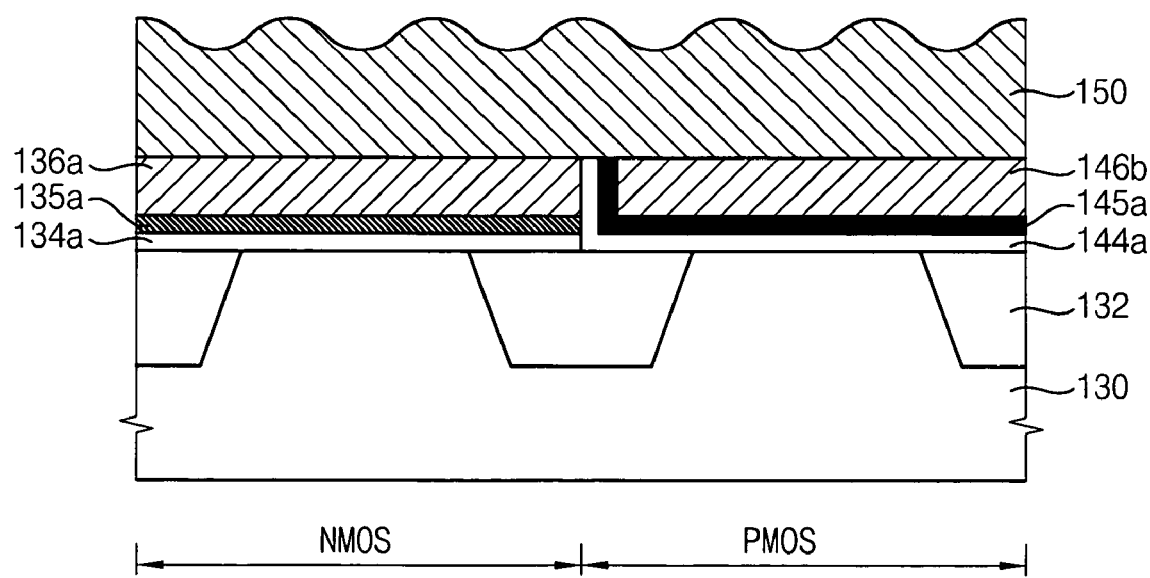
Figure 6G:
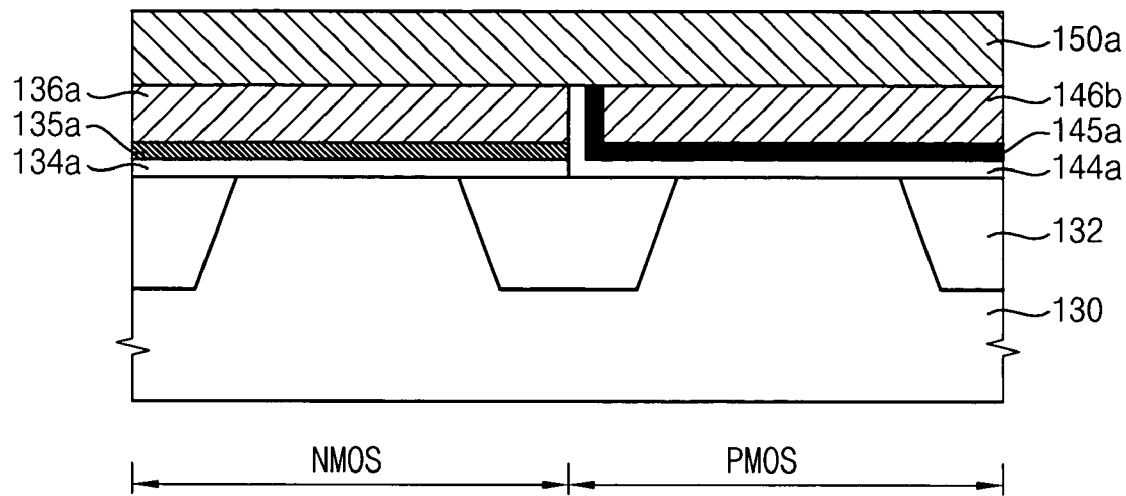
Figure 6H:
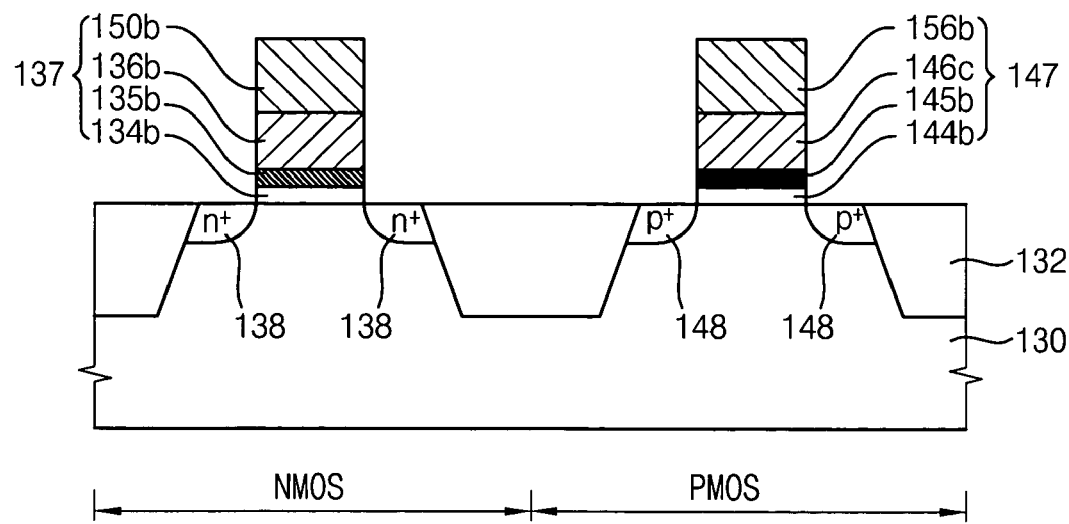

As shown in FIG. 6F, a third gate conductor layer 150 is formed, for example, of doped polysilicon. The integrated circuit device is then further processed, for example, by chemical mechanical polishing, to provide the third gate conductive layer structure 150a illustrated in FIG. 6G. In some embodiments of the present invention, the third gate conductive layer structure 150a has a thickness of about 450 angstroms (Å). The third gate conductive layer 150a may be formed from doped polysilicon, a metal such as tungsten (W), molybdenum (Mo), titanium (Ti), tantalum (Ta), aluminum (Al), copper (Cu), hafnium (Hf), or zirconium (Zr) or of a metal nitride, such as molybdenumnitride (MoN), titanium nitride (TiN), tantalum nitride (TaN), hafnium nitridie (HfN), zirconium nitride (ZrN), aluminum (AlN) or tantalum silicon nitride (TaSiN). The first gate conductor layer 135a in the NMOS type device doped region, in some embodiments of the present invention, has a thickness less than half of a total thickness of the first and third gate conductor layers 136a, 150a, or the second and third gate conductor layers 146b, 150a. The structure of FIG. 6G is then patterned to form a first gate structure 137 and second gate structure 147 as illustrated in FIG. 6H and described previously with reference to FIG. 1.

Figure 6I:
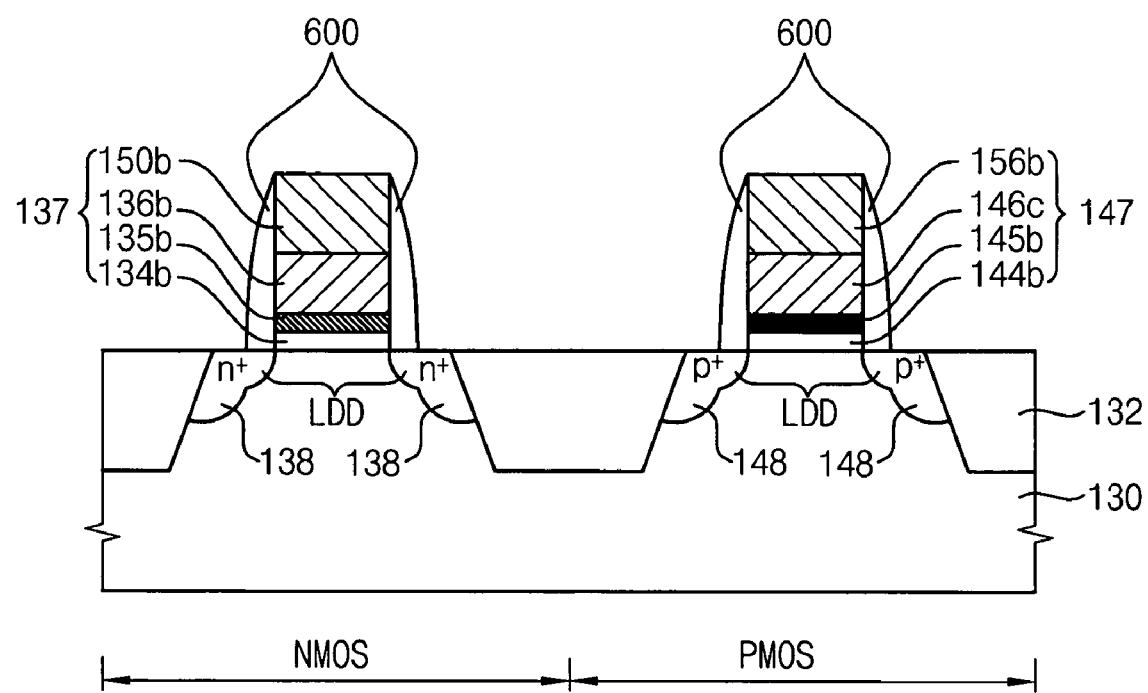

The semiconductor substrate 130 is doped to form the first source/drain regions 138 and the second source/drain regions 148 with the respective dopings in the corresponding NMOS and PMOS doped active regions as shown in FIG. 6H. It will be understood that the sequence of patterning and doping in the respective regions may vary during formation thereof. In addition, as shown in FIG. 6I, an insulation layer 600 may be formed on the sidewalls of the respective gate structures 137, 147. In such embodiments, the respective source/drain regions 138, 148 may include a lightly doped drain (LDD) formed prior to forming the sidewalls 600 after which a heavily doped impurity distribution may be implanted to complete forming the source/drain regions 138, 148 as will be understood by those of skill in the field of semiconductor processing.

Figure 7:
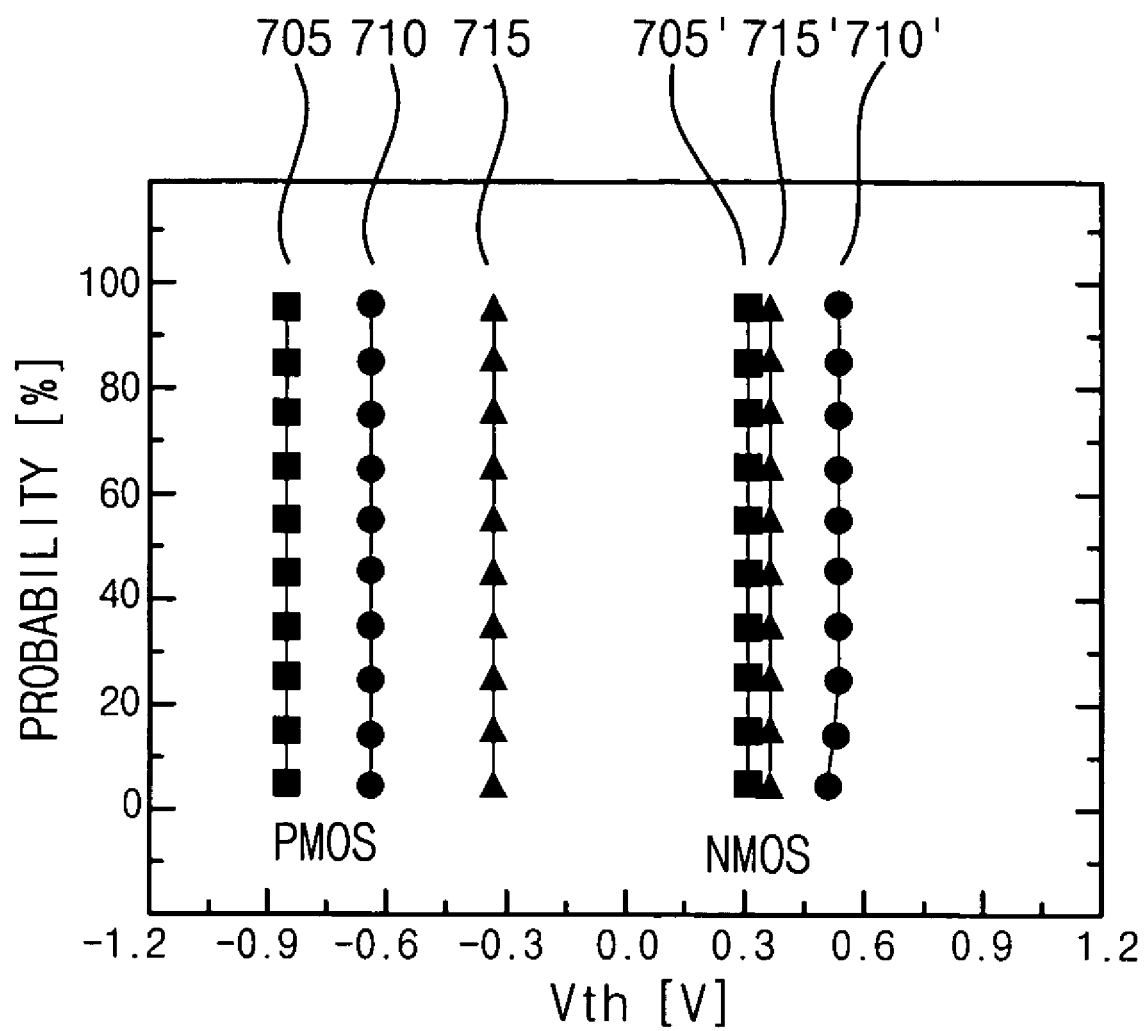
FIG. 7 is a graph illustrating threshold voltage for transistors including a gate structure according to some embodiments of the present invention.

Test results for particular embodiments of the present invention will now be described with reference to FIGS. 7, 8A-8B, 9A-9B and 10A-10B. FIG. 7 illustrates threshold voltage distribution probabilities for a PMOS device using, respectively, a gate insulation layer of hafnium silicon oxynitride (HfSiON) 705, hafnium aluminum oxynitride (HfAlON) 710 and, as a control reference, silicon oxynitride (SiON) 715. Corresponding results for an NMOS device are also shown 705', 710', 715'. In comparison to the results for the silicon oxynitride, hafnium aluminum oxynitride as a gate insulation layer for a PMOS device appears to provide better results for threshold voltage characteristics as the data 710 is closer to the data 715 results. The hafnium silicon oxynitride 705 appears closer for the NMOS type devices.

Figure 8A:
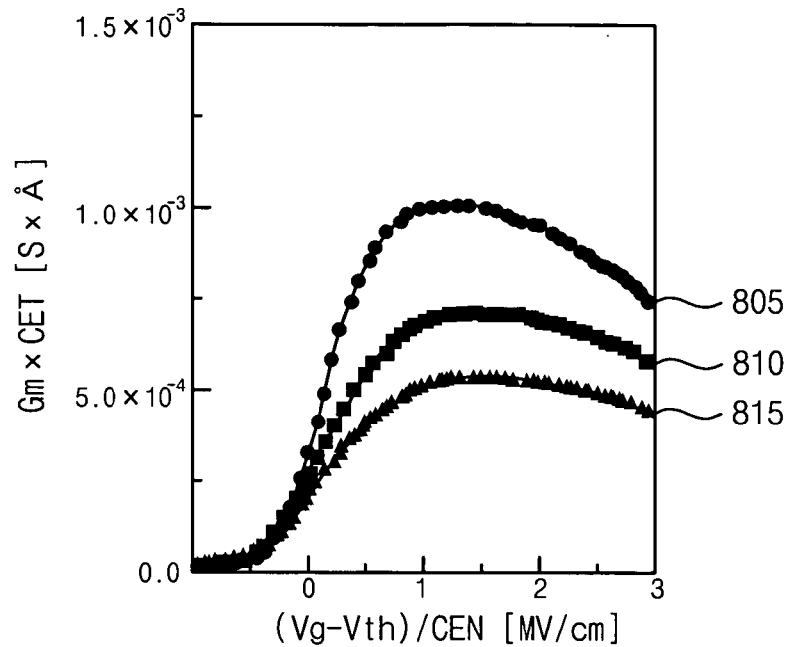
FIG. 8A is a graph illustrating mobility for a NMOS transistor including a gate structure according to some embodiments of the present invention.
Figure 8B:
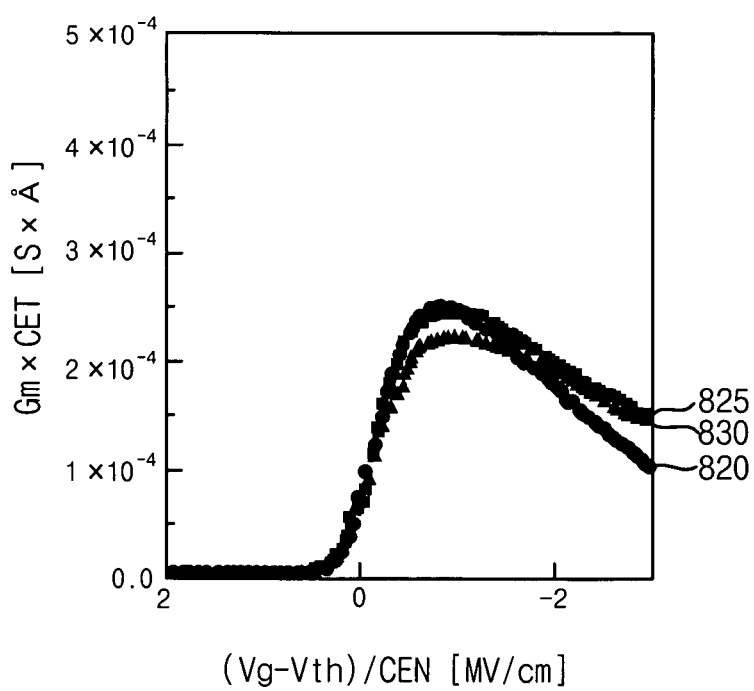
FIG. 8B is a graph illustrating mobility for a PMOS transistor including a gate structure according to some embodiments of the present invention.

FIG. 8A illustrates mobility results for an NMOS transistor device while FIG. 8B includes corresponding data for a PMOS transistor device. Again, data is shown for a reference silicon oxynitride gate insulation layer 805, 820, a hafnium silicon oxynitride gate insulation layer 810, 825 and a hafnium aluminum oxynitride gate insulation layer 815, 830. While there is little variability illustrated for the PMOS device for mobility, FIG. 8A indicates that, for an NMOS transistor device, hafnium silicon oxynitride 810 may provide better comparative performance than the hafnium aluminum oxynitride 815.

Figure 9A:
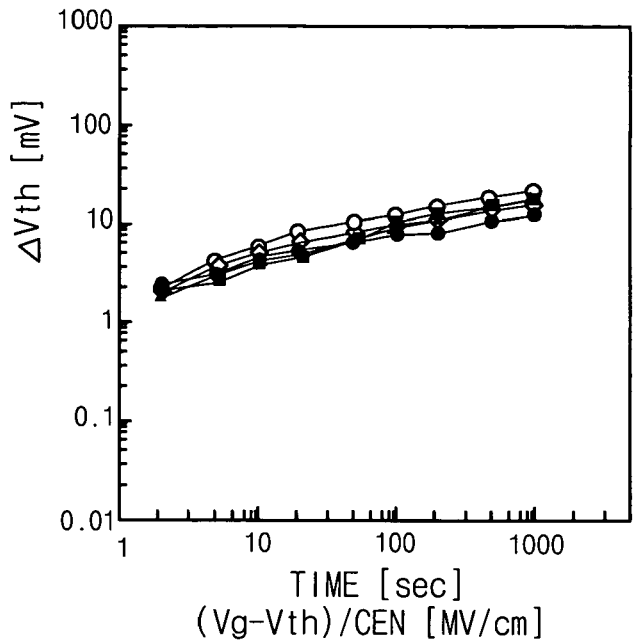
FIG. 9A is a graph illustrating bias temperature instability for a NMOS transistor including a gate structure according to some embodiments of the present invention.
Figure 9B:
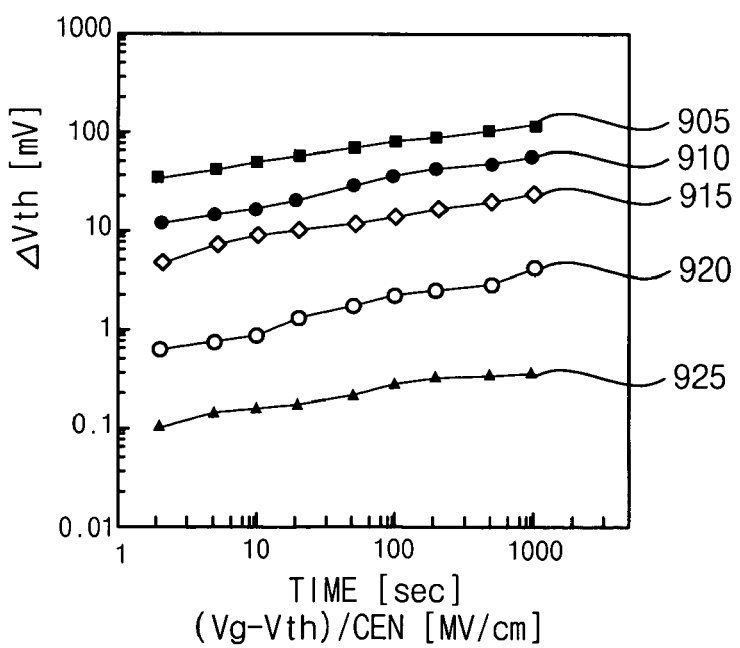
FIG. 9B is a graph illustrating bias temperature instability for a PMOS transistor including a gate structure according to some embodiments of the present invention.

Test results for bias temperature instability are shown for a PMOS device in FIG. 9A (negative bias temperature instability (NBTI)) and for a NMOS device in FIG. 9B (positive bias temperature instability (PBTI)). With respect to FIG. 9A, little variation is seen between the different gate insulation materials. However, with reference to FIG. 9B, variation is seen between the silicon oxynitride gate insulation layer results 925, the hafnium silicon oxynitride results 915, 920 and the hafnium aluminum oxynitride results 905, 910. Note that the multiple results for each of the high dielectric constant gate insulation materials are based on the thickness of the layers utilized. For example, the results 920 correspond to a hafnium silicon oxynitride layer of a 25 angstrom (Å) thickness while the results 915 correspond to a hafnium silicon oxynitride layer of a 30 angstrom (Å) thickness. It will be understood that this variation may also be dependent generally upon the ratio of hafnium to silicon in the respective layers as well as the thickness of those layers. The results based on bias temperature instability, as shown in FIG. 9B, may indicate an improved performance for the hafnium silicon oxynitride in the case of a NMOS device as a smaller change in threshold voltage is generally desireable.

Figure 10A:
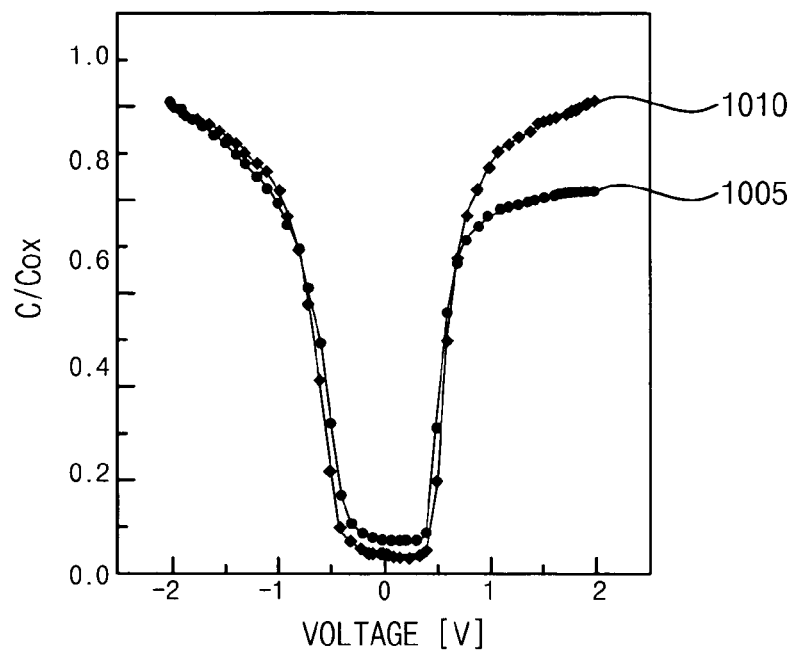
FIG. 10A is a graph illustrating C/Cox versus Voltage for a NMOS transistor including a gate structure according to some embodiments of the present invention.
Figure 10B:
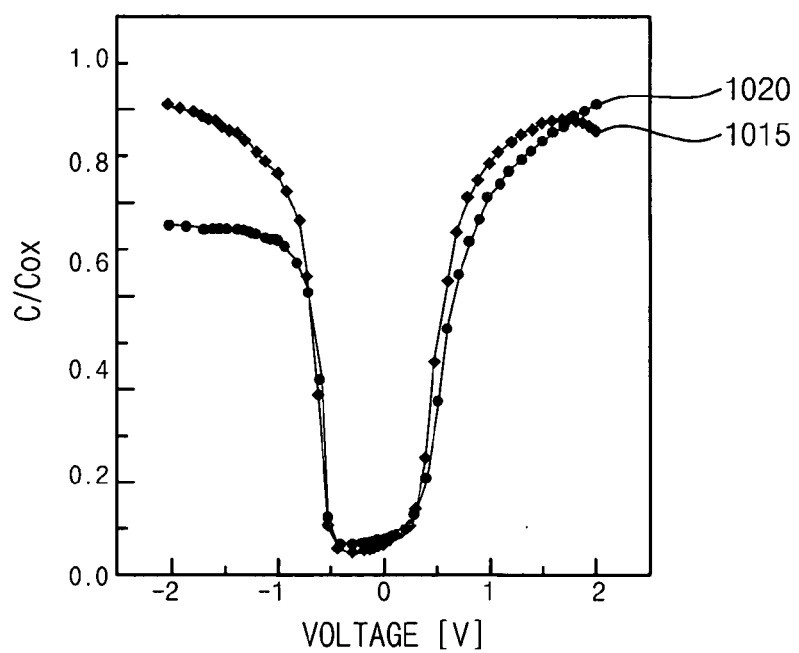
FIG. 10B is a graph illustrating C/Cox versus Voltage for a PMOS transistor including a gate structure according to some embodiments of the present invention.

Test results for the capacity and voltage curves are illustrated in FIGS. 10A and 10B. The test results in FIGS. 10A and 10B are utilized to illustrate differences between a MIPS and polysilicon electrode layer structure. For the NMOS device of FIG. 10A, a polysilicon gate electrode is shown by the data 1005 and MIPS gate electrode is shown by the data 1010, each for a hafnium silicon oxynitride gate insulation layer. The MIPS structure may include a polysilicon gate with a tantalum nitride metal layer having a thickness of about 20 angstroms (Å). Note that, for the NMOS device illustrated in FIG. 10A, the operating region lies in the positive voltage region where the MIPS device data 1010 appears to indicate improved performance. For the PMOS device of FIG. 10B, the respective operating region is in the negative voltage region where the MIPS structure data 1015 appears to indicate better performance than the polysilicon gate data 1020. Note that the data of FIG. 10B is based on a gate insulation layer formed of hafnium aluminum oxynitride rather than hafnium silicon oxynitride as described with reference to FIG. 10A.

To summarize generally the test results of FIGS. 7 through 10B, for a hafnium aluminum oxynitride high dielectric constant material gate insulation layer in an NMOS transistor structure or a PMOS transistor structure some degradation may be provided in threshold voltage compared to a silicon oxynitride gate insulation layer. Some degradation in bias temperature instability may also result in the NMOS structure, although no noticeable degradation is indicated for hafnium aluminum oxynitride when utilized with a PMOS device. The hafnium aluminum oxynitride also comes closer to the mobility characteristics of the silicon oxynitride structure in the NMOS device. While some gate depletion may occur for a hafnium aluminum oxynitride gate insulation layer, the effects of gate depletion may be reduced utilizing a MIPS structure as described for some embodiments herein.

With respect to the data based on the hafnium silicon oxynitride, high dielectric constant gate insulation layer, there is substantially no degradation shown in the threshold voltage characteristics for a NMOS device, although there is some degradation indicated for a PMOS device. As such, hafnium aluminum oxynitride may be utilized in some embodiments of the present invention for the gate insulation layer of the PMOS region gate electrode structure. The hafnium silicon oxynitride gate insulation layer shows no significant bias temperature instability degradation for either the NMOS or the PMOS structure. A limited amount of mobility degradation is shown for both the PMOS device, for which the degradation may be very limited, and the NMOS device. Gate depletion characteristics shown are similar to those associated with the hafnium aluminum oxynitride as discussed previously. Thus, summarizing the particular results described herein, in some embodiments of the present invention, hafnium aluminum oxynitride may be selected for the PMOS transistor gate insulation layer based on threshold voltage characteristics and hafnium silicon oxynitride may be selected for the gate insulation layer of the NMOS gate electrode based on bias temperature instability degradation characteristics. In addition, in further embodiments of the present invention, a MIPS gate electrode may be utilized to reduce gate depletion characteristics.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An integrated circuit device, comprising:
    a semiconductor substrate having a first doped region and a second doped region having a different doping type than the first doped region; and
    a gate electrode structure on the semiconductor substrate extending between the first and second doped regions and having a gate insulation layer having a uniform composition of a first high dielectric constant material in the first doped region and a uniform composition of a second high dielectric constant material, different from the first high dielectric constant material, in the second doped region and a gate electrode on the gate insulation layer,
    wherein the first doped region includes a NMOS device and the second doped region includes a PMOS device and the gate insulation layer having a uniform composition of the first high dielectric constant material is on a channel region of the NMOS device and the gate insulation layer having a uniform composition of the second high dielectric constant material is on a channel of the PMOS device,
    wherein the first high dielectric constant material comprises at least one of hafnium silicon oxide and hafnium silicon oxynitride and wherein the second high dielectric constant material comprises at least one of hafnium aluminum oxide and hafnium aluminum oxynitride.

2. The integrated circuit device of claim 1 wherein the gate electrode structure comprises a multi-layer structure including a metal layer or metal nitride layer and a polysilicon layer.

3. An integrated circuit device, comprising:
    a semiconductor substrate having a first doped region and a second doped region having a different doping type than the first doped region;

a first gate electrode structure on the semiconductor substrate in the first doped region, the first gate electrode structure comprising:
  a first uniform composition gate insulation layer on the semiconductor substrate, the first uniform composition gate insulation layer comprising a first high dielectric constant material; and
  a first gate electrode on the first uniform composition gate insulation layer; and
a second gate electrode structure on the semiconductor substrate in the second doped region, the second gate electrode structure comprising:
  a second uniform composition gate insulation layer on the semiconductor substrate, the second uniform composition gate insulation layer comprising a second high dielectric constant material different from the first high dielectric constant material; and
  a second gate electrode on the second uniform composition gate insulation layer,
wherein the first doped region includes a NMOS device and the second doped region includes a PMOS device and the first uniform composition gate insulation layer is on a channel region of the NMOS device and the second uniform composition gate insulation layer is on a channel region of the PMOS device,
wherein the first high dielectric constant material comprises at least one of hafnium silicon oxide and hafnium silicon oxynitride and wherein the second high dielectric constant material comprises at least one of hafnium aluminum oxide and hafnium aluminum oxynitride.

4. The integrated circuit device of claim 3 wherein the first and second gate electrodes comprise multi-layer structures including a metal layer or metal nitride layer and a polysilicon layer.

5. The integrated circuit device of claim 3 wherein the first and second gate electrode structures comprise a single electrode structure extending between the NMOS and PMOS devices and wherein the single electrode structure extends across an isolation region between the first and second doped regions with the first and second electrodes comprising a common gate electrode and wherein the single electrode structure includes a fence structure over the isolation region comprising a layer of one of the first or second high dielectric constant materials extending away from the semiconductor substrate into the common gate electrode.

6. The integrated circuit device of claim 3, wherein the first and second uniform composition gate insulation layers comprise undoped layers.

7. The integrated circuit device of claim 1 wherein the first high dielectric material does not include any aluminum oxides or aluminum oxynitrides.

8. The integrated circuit device of claim 3 wherein the first high dielectric material does not include any aluminum oxides or aluminum oxynitrides.

9. The integrated circuit device of claim 7 wherein the second high dielectric material does not include any silicon oxides or silicon oxynitrides.

10. The integrated circuit device of claim 8 wherein the second high dielectric material does not include any silicon oxides or silicon oxynitrides.

11. The integrated circuit device of claim 1, wherein the gate insulation layer comprises an undoped layer.

* * * * *